United States Patent [19]
Ikeda

[11] Patent Number: 5,502,327
[45] Date of Patent: Mar. 26, 1996

[54] SEMICONDUCTOR DEVICE

[75] Inventor: Motohisa Ikeda, Kawasaki, Japan

[73] Assignee: Fujitsu Limited, Kawasaki, Japan

[21] Appl. No.: 288,035

[22] Filed: Aug. 10, 1994

[30] Foreign Application Priority Data

Sep. 2, 1993 [JP] Japan .................................. 5-218700

[51] Int. Cl.$^6$ .............................. H01L 27/02; H01L 29/02
[52] U.S. Cl. .......................... 257/539; 257/786; 257/904
[58] Field of Search .................................. 257/539, 536, 257/537, 904, 786, 692

[56] References Cited

U.S. PATENT DOCUMENTS 4,486,770 12/1984 Woodward .............................. 257/539
4,926,378 5/1990 Uchida et al. ........................... 257/539

FOREIGN PATENT DOCUMENTS 59-188960 10/1994 Japan ..................................... 257/539

OTHER PUBLICATIONS

Muller et al. "Device Electronics for Integrated Circuits", John Wiley & Sons ©1986 pp. 113–114.

Primary Examiner—Donald L. Monin, Jr.
Attorney, Agent, or Firm—Nikaido, Marmelstein, Murray & Oram

[57] ABSTRACT

A semiconductor device includes a first layer made of a first type semiconductor, a second layer provided on the first layer and made of a second type semiconductor, the second layer including low resistance diffusion parts and high resistance diffusion parts, where the first and second type semiconductors are one and the other of n-type and p-type semiconductors, a third layer provided on the low resistance diffusion parts of the second layer and made of the first semiconductor type, thereby forming a pair of transistors which form a flip-flop and use the high resistance diffusion parts as balanced load resistors, and at least first and second isolations isolating the flip-flop. Each of the high resistance diffusion parts of the second layer comprise a first linear part separated by a predetermined distance from the first isolation, a second linear part separated by the predetermined distance from the second isolation and having a width identical to that of the first linear part, and a third linear part connecting the first and second linear parts.

22 Claims, 5 Drawing Sheets

SEMICONDUCTOR DEVICE

BACKGROUND OF THE INVENTION

The present invention generally relates to semiconductor devices, and more particularly to a semiconductor device having a resistor pair and applicable to semiconductor devices such as a bipolar static random access memory (RAM).

FIGS. 1 and 2 respectively show cross sections of examples of the conventional load resistance type bipolar static RAM. FIG. 3 shows a plan view of the conventional load resistance type bipolar static RAMs shown in FIGS. 1 and 2, and FIG. 4 shows a circuit diagram of these conventional load resistance type bipolar static RAMs. In FIG. 4, WL denotes a word line, and HL denotes a hold line.

In FIGS. 1 and 2, $n^+$-type buried layer 11 is formed in a p-type substrate 10, and an n-type layer 12 is formed on the $n^+$-type buried layer 11. A polysilicon layer 14 is provided above the n-type layer 12 via an insulator oxide layer 31. An insulator layer 32 is provided as shown.

The polysilicon layer 14 is divided into low resistance diffusion portions 14a and 14b, and a high resistance diffusion part 14c. The low resistance diffusion portions 14a and 14b are respectively provided within masks surrounded by dotted lines A1 and A2 in FIG. 3, and p-type impurities are diffused within these low resistance diffusion portions 14a and 14b at a low impurity concentration. The high resistance diffusion part 14c is provided within a mask surrounded by a dotted line A3 in FIG. 3, and p-type impurities are diffused within this high resistance diffusion part 14c at a high impurity concentration. A word line electrode W1 is formed on the low resistance diffusion part 14a. A base electrode B1, an n-type layer 15 which becomes an emitter for holding, an emitter electrode EH1, an n-type layer 16 which becomes an emitter for sensing, and an emitter electrode ES1 are formed on the low resistance diffusion part 14b. The high resistance diffusion part 14c is used as a load resistor R1. A collector C1 is formed on the n-type layer 12. In FIG. 1, a p-type isolation 17 is provided around the n-type layer 12. In FIG. 2, an isolation 17 formed by an insulator is provided around the n-type layer 12.

The sheet resistance ratio between the low resistance diffusion part 14a or 14b and the high resistance diffusion part 14c is in the range of 1:50 to 1:100, and the actual resistance of the load resistor R1 is determined by the high resistance diffusion part 14c. The resistance of the load resistor R1 can be described by the following formula, where L denotes a low resistance diffusion interval L in FIG. 5 which shows a partially enlarged plan view, W denotes a polysilicon width W in FIG. 5, $\sigma$ denotes a sheet resistance, and R1 denotes the resistance of the load resistor R1.

$$R1 = \sigma \cdot L/W$$

In FIG. 5, when an alignment error between a mask which forms the polysilicon layer 14 and a mask which forms the isolation 17 is taken into consideration, no problem will occur for the alignment error in a direction X but a problem will occur for the alignment error in a direction Y.

In other words, if the mask which forms the polysilicon layer 14 shifts downwards in FIG. 5, the polysilicon layer 14 will partially overlap the isolation 17. In this case, the polysilicon width W becomes narrow and the actual resistance of the load resistor R1 becomes large. On the other hand, with regard to a load resistor R2 on the opposite side from the load resistor R1 and forming a flip-flop of a memory cell, the polysilicon layer shifts in a direction so as to separate from the isolation, and the actual resistance of the load resistor R2 will not change.

In the case where the load resistor R1 is formed as a thin film resistor by forming the polysilicon layer 14 on the substrate 10, the portion of the polysilicon layer 14 overlapping the stepped or sloping portion of the isolation 17 becomes thinner compared to other portions of the polysilicon layer 14. It is for this reason that the polysilicon width W substantially becomes narrow and the actual resistance of the load resistor R1 becomes large.

On the other hand, in the case where the load resistor R1 is formed by ion implantation into the substrate 10, the injected ions landing on the isolation 17 will not form a resistor at the isolation 17. In other words, only the diffused or doped region of the substrate 10 becomes the load resistor R1. It is for this reason that the resistor width substantially becomes narrow and the actual resistance of the load resistor R1 becomes large.

For example, when the resistances of the pair of load resistors R1 and R2 of the flip-flop forming the memory cell becomes unbalanced, there was a problem in that the soft error which is the inverse number of the probability of an erroneous operation occurring due to the a-ray becomes unbalanced between the case where the memory cell holds a logic value "1" and the case where the memory cell holds a logic value "0".

Furthermore, problems occurred where a resistor pair needed to have balanced resistances in order for the semiconductor device to carry out the designed operations.

SUMMARY OF THE INVENTION

Accordingly, it is a general object of the present invention to provide a novel and useful semiconductor device in which the problems described above are eliminated.

Another and more specific object of the present invention is to provide a semiconductor device comprising a first layer made of a first type semiconductor, a second layer provided on the first layer and made of a second type semiconductor, the second layer including low resistance diffusion parts and high resistance diffusion parts, where the first and second type semiconductors are one and the other of n-type and p-type semiconductors, a third layer provided on the low resistance diffusion parts of the second layer and made of the first semiconductor type, thereby forming a pair of transistors which form a flip-flop and use the high resistance diffusion parts as balanced load resistors, and at least first and second isolations isolating the flip-flop, where each of the high resistance diffusion parts of the second layer comprise a first linear part separated by a predetermined distance from the first isolation, a second linear part separated by the predetermined distance from the second isolation and having a width identical to that of the first linear part, and a third linear part connecting the first and second linear parts. According to the semiconductor device of the present invention, even when the alignment error of a mask for forming the second layer occurs, the resistances of the load resistors of the flip-flop will not become unbalanced. As a result, when the present invention is applied to a memory, it becomes possible to prevent the soft error from becoming unbalanced between the case where the memory cell formed by the flip-flop holds a logic value "1" and the case where the memory cell holds a logic value "0".

Still another object of the present invention is to provide a semiconductor device comprising a first stepped portion, a second stepped portion substantially parallel to the first stepped portion, a first resistor part provided substantially parallel to the first stepped portion, a second resistor part provided substantially parallel to the second stepped portion, and a connecting part connecting the first and second resistor parts. According to the semiconductor device of the present invention, it is possible to maintain the resistances of the first and second resistor parts balanced regardless of whether the first and second resistor parts are made up of thin film resistors or diffused regions injected with impurities by ion implantation. In other words, the positioning error of the mask which is used to form the first and second resistor parts relative to the first and second stepped portions will not affect the balanced state of the resistances of the first and second resistor parts.

Other objects and further features of the present invention will be apparent from the following detailed description when read in conjunction with the accompanying drawings.

DESCRIPTION OF THE PREFERRED EMBODIMENTS

Figure 1:
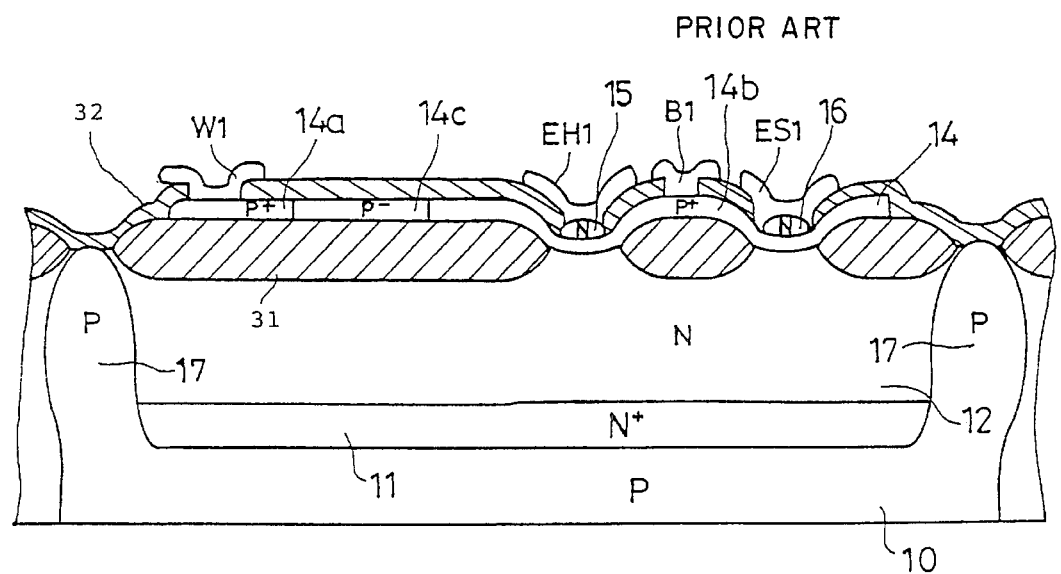
FIG. 1 is a cross sectional view showing the construction of an example of a conventional load resistance type bipolar static RAM.
Figure 2:
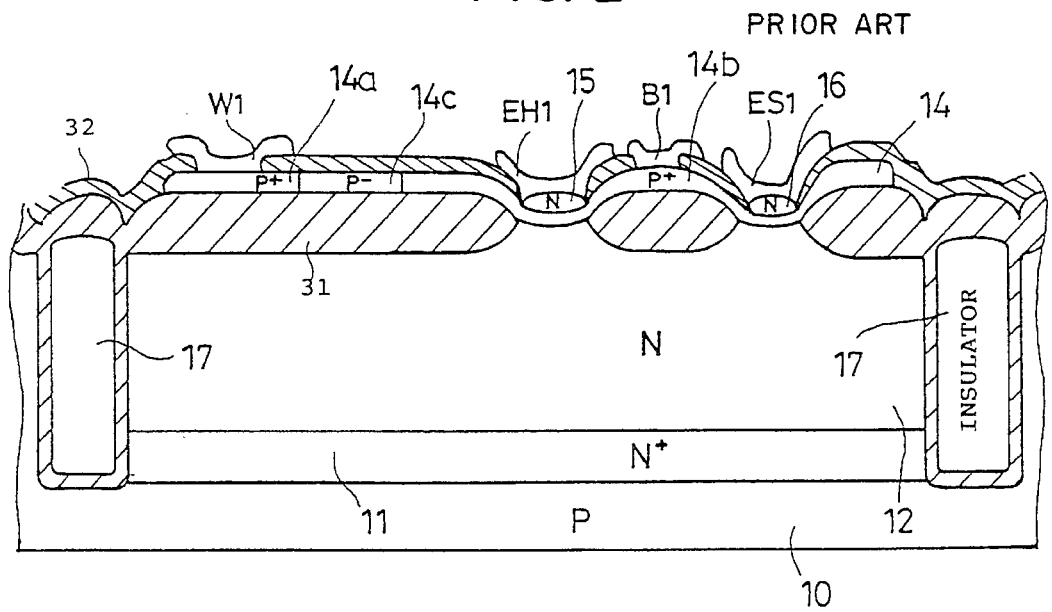
FIG. 2 is a cross sectional view showing the construction of an example of the conventional load resistance type bipolar static RAM.
Figure 3:
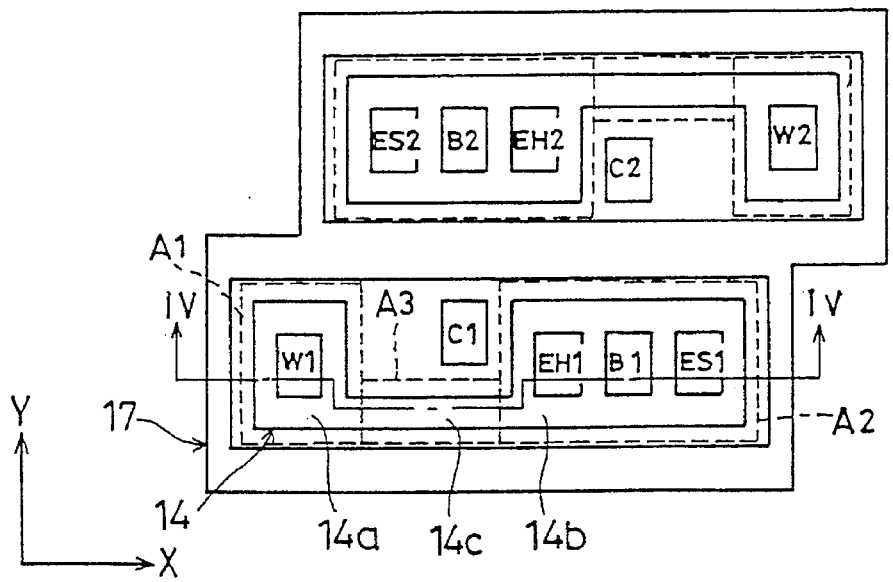
FIG. 3 is a plan view showing the conventional load resistance type bipolar static RAMs shown in FIGS. 1 and 2.
Figure 6:
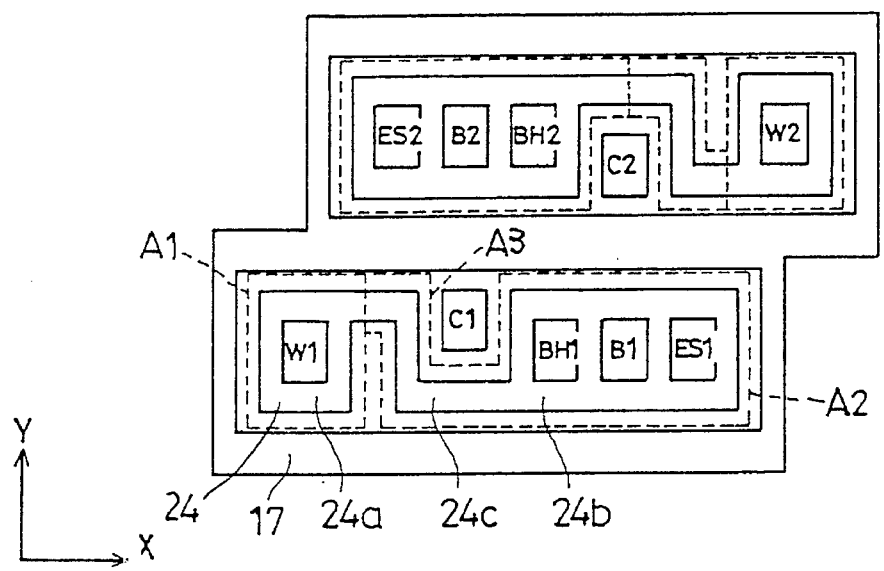
FIG. 6 is a plan view showing an important part of an embodiment of a semiconductor device according to the present invention.
Figure 7:
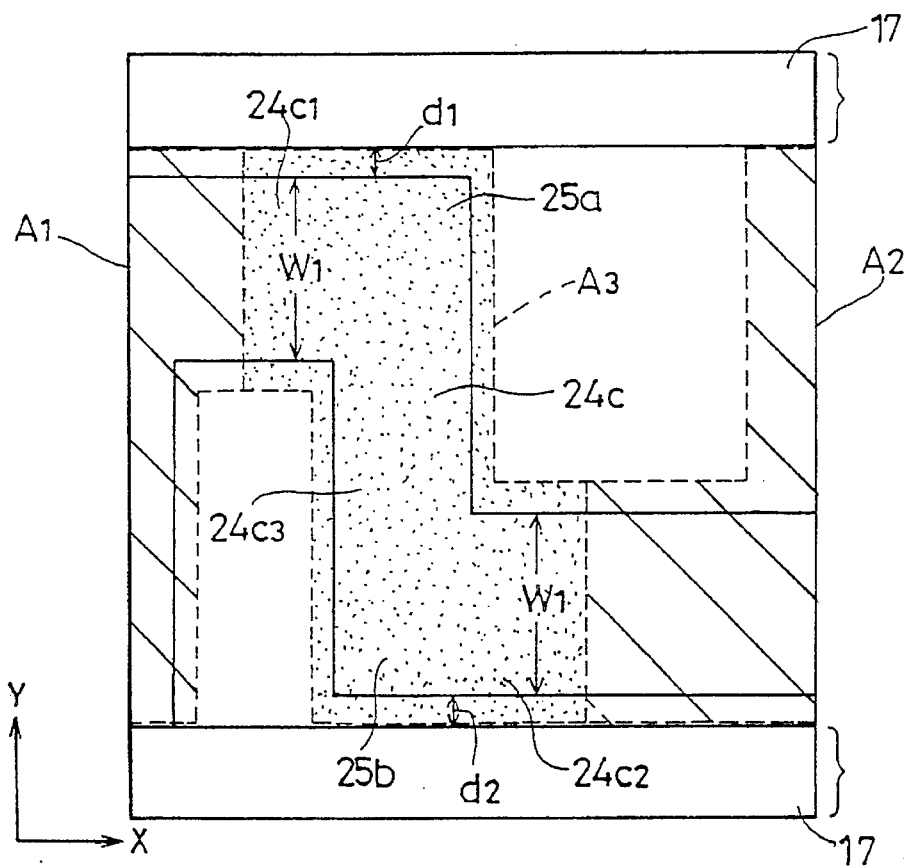
FIG. 7 is a plan view showing a part of the embodiment of the semiconductor device on an enlarged scale.

FIG. 6 shows a plan view of an embodiment of a semiconductor device according to the present invention, and FIG. 7 shows an enlarged plan view of a part of this embodiment. In FIGS. 6 and 7, those parts which are the same as those corresponding parts in FIG. 3 are designated by the same reference numerals, and a description thereof will be omitted.

In FIGS. 6 and 7, a polysilicon layer 24 is divided into low resistance diffusion parts 24a and 24b within respective masks surrounded by dotted lines A1 and S2 at both ends along a direction A, and a high resistance diffusion part 24c within a mask surrounded by a dotted line A3. The low resistance diffusion parts 24a and 24b respectively have p-type impurities diffused therein at a high impurity concentration. The high resistance diffusion part 24c has p-type impurities diffused therein at a low impurity concentration.

In the polysilicon layer 24, the shapes of the low resistance diffusion parts 24a and 24b in the plan view are similar to those of the conventional device, however, the shape of the high resistance diffusion part 24c in the plan view is different from that of the conventional device. In the plan view, the high resistance diffusion part 24c has an approximate Z-shape.

As shown in FIG. 7, the high resistance diffusion part 24c includes a first linear part 24c1 having a width W1 and extending in the direction X from the low resistance diffusion part 24a, a second linear part 24c2 having a width Q1 and extending in the direction X from the low resistance diffusion part 24b, and a third linear part 24c3 extending in a direction Y and connecting the linear parts 24c1 and 24c2. A right-angle bent part 25a is formed between the linear parts 24c1 and 24c3, and a right-angle bent part 25b is formed between the linear parts 24c2 and 24c3. In addition, a separation distance d1 from the linear part 24c1 to an isolation 17 and a separation distance d2 from the linear part 24c2 to the isolation 17 are set to become equal in a state where no alignment error exists.

When the mask for forming the polysilicon layer 24 shown in FIG. 7 shifts in the direction X with respect to the mask for forming the isolation 17, no problems will occur, similarly as in the case of the conventional device.

On the other hand, even when the mask for forming the polysilicon layer 24 shifts in the direction Y with respect to the isolation 17, no problems will occur in this embodiment. For example, if the mask for forming the polysilicon layer 24 shifts downwards in FIG. 7, a portion of the linear part 24c2 overlaps the isolation 17, thereby making the width W1 of the linear part 24c2 narrow and the actual resistance of the load resistor R1 formed by the high resistance diffusion part 24clarge. However, with regard to a load resistor R2 on the opposite side from the load resistor R1 and forming a flip-flop of a memory cell, a portion of the linear part 24c1 also overlaps an isolation 17, thereby making the width W1 of the linear part 24c2 narrow and the actual resistance of the load resistor R2 formed by the high resistance diffusion part 24c large. The actual resistance of the load resistor R2 increases by the same amount as the increase of the actual resistance of the load resistor R1. In this embodiment, the shape of the high resistance part 24c in the plan view is symmetrical about a center thereof in both the directions X and Y.

Accordingly, even when the alignment error of the mask occurs, the resistances of the load resistors R1 and R2 of the flip-flop forming the memory cell will not become unbalanced. As a result, it becomes possible to prevent the soft error from becoming unbalanced between the case where the memory cell holds a logic value "1" and the case where the memory cell holds a logic value "0."

The resistor pair may be made up of thin film resistors formed on the substrate as described above or, made up of diffused or doped regions which are formed by injecting impurities into the substrate by ion implantation. The effect of maintaining the balanced resistances of the resistor pair is the same for these two cases.

Figure 4:
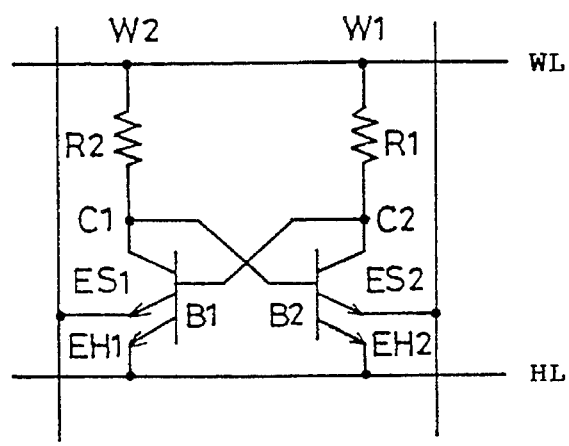
FIG. 4 is a circuit diagram showing the conventional load resistance type bipolar static RAM.
Figure 5:
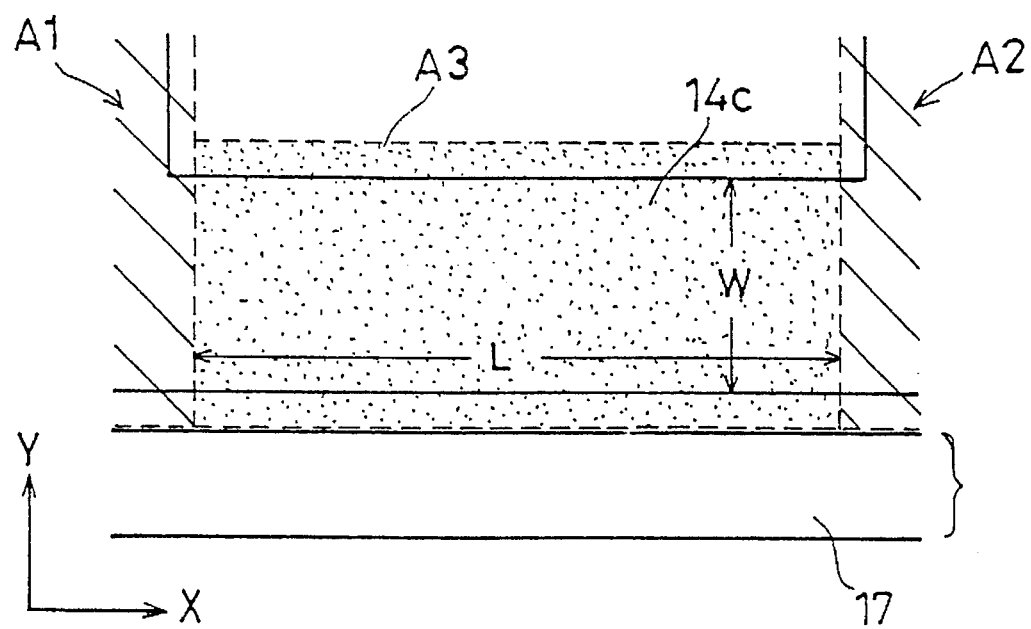
FIG. 5 is a plan view showing a part of the conventional load resistance type bipolar static RAM on an enlarged scale.

Of course, the present invention may be applied to semiconductor devices other than the load resistance type bipolar static RAM shown in FIG. 4.

Figure 8:
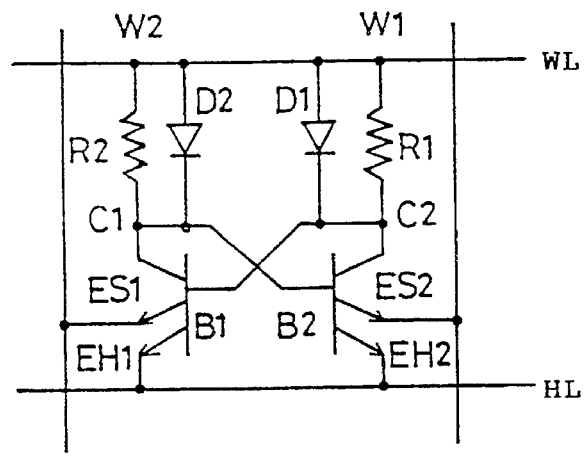
FIG. 8 is a circuit diagram showing a diode clamp type bipolar static RAM to which the present invention may be applied.

FIG. 8 shows a circuit diagram of a diode clamp type bipolar static RAM to which the present invention may be applied. In FIG. 8, those parts which are the same as those corresponding parts in FIG. 4 are designated by the same reference numerals, and a description thereof will be omitted. In FIG. 8, a diode D1 is provided in parallel with the load resistor R1, and a diode D2 is provided in parallel with the load resistor R2, so that a high-speed operation becomes possible by reducing the impedance of the load elements.

Figure 9:
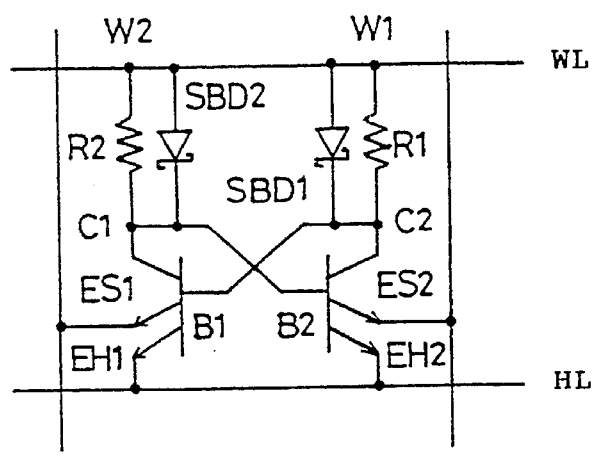
FIG. 9 is a circuit diagram showing a diode clamp type bipolar static RAM to which the present invention may be applied.

FIG. 9 shows a circuit diagram of a diode clamp type bipolar static RAM to which the present invention may be applied. In FIG. 9, those parts which are the same as those corresponding parts in FIG. 4 are designated by the same reference numerals, and a description thereof will be omitted. In FIG. 9, a Schottky barrier diode DZ1 is provided in parallel with the load resistor R1, and a Schottky barrier diode DZ2 is provided in parallel with the load resistor R2, so that a high-speed operation becomes possible by reducing the impedance of the load elements.

In the above described embodiment, the n-type semiconductors may be replaced by the p-type semiconductors and vice versa. In addition, the materials used for each layer of the semiconductor device are not limited to those of the described embodiment.

Further, the present invention is not limited to these embodiments, but various variations and modifications may be made without departing from the scope of the present invention.

What is claimed is:

1. A semiconductor device comprising:

a first layer made of a first type semiconductor;

a second layer provided on said first layer and made of a second type semiconductor, said second layer including low resistance diffusion parts and high resistance diffusion parts, said first and second type semiconductors being one and the other of n-type and p-type semiconductors;

a third layer provided on the low resistance diffusion parts of said second layer and made of the first semiconductor type, thereby forming a pair of transistors which form a flip-flop and use the high resistance diffusion parts as balanced load resistors; and first and second isolation regions respectively provided with respect to said pair of transistors, and with a predetermined interval between the first and second isolation regions such that the pair of transistors are accommodated within an area between said first and second isolation regions, said first and second isolation regions respectively having a stepped surface;

each of said high resistance diffusion parts of said second layer comprising:

a first linear part separated by a predetermined distance from said first isolation region, wherein said first linear part includes a first end and a second end, wherein one of said first and second ends form a terminal thereof, said first linear part being located closer to said first isolation region than a central portion of the high resistance diffusion part;

a second linear part separated by said predetermined distance from said second isolation region and having a width identical to that of the first linear part, wherein said second linear part includes a first end and a second end, wherein one of said first and second ends forms a terminal thereof, said second linear part being located closer to the second isolation region than a central portion of the high resistance diffusion part; and a third linear part connecting the first and second linear parts.

2. The semiconductor device as claimed in claim 1, wherein each of said high resistance diffusion parts have a symmetrical shape in a plan view about a center thereof in both a first direction in which said first and second isolations extend and in a second direction which is perpendicular to the first direction, said widths of the first and second linear parts being taken along the second direction.

3. The semiconductor device as claimed in claim 2, wherein each of said high resistance diffusion parts have an approximate Z-shape in a plan view.

4. The semiconductor device as claimed in claim 1, wherein said flip-flop forms a memory cell.

5. The semiconductor device as claimed in claim 1, wherein said flip-flop forms a memory cell of a load resistance type bipolar static random access memory.

6. The semiconductor device as claimed in claim 1, wherein said flip-flop forms a memory cell of a diode clamp type semiconductor memory device.

7. The semiconductor device as claimed in claim 6, which further comprises:

a pair of diodes respectively provided in parallel with corresponding ones of the pair of load resistors of the flip-flop.

8. The semiconductor device as claimed in claim 6, which further comprises:

a pair of Schottky barrier diodes respectively provided in parallel with corresponding ones of the pair of load resistors of the flip-flop.

9. The semiconductor device as claimed in claim 1, wherein said second layer is made of polysilicon.

10. The semiconductor device as claimed in claim 1, wherein said stepped surfaces of first and second isolation regions are substantially parallel to each other, said first linear part is provided substantially parallel to said second isolation region and extends along said second isolation, and said second linear part is provide substantially parallel to said first isolation region and extends along said first isolation region.

11. A pair of resistance elements coupled to a pair of transistors forming a flip-flop circuit, each resistance element comprising:

first and second linear parts, each of said first and second linear parts being selectively doped; and a connection part connecting said first and second linear parts, said each resistance element being provided in a region defined between first and second dielectric isolation regions, said first and second dielectric isolation regions having a predetermined distance therebetween, said first linear part being located closer to said first isolation region than a central portion of said region defined between said first and second dielectric isolation regions, and said second linear part being located closer to said second isolation region than the central portion of said region defined between said first and second dielectric isolation regions.

12. The semiconductor device as claimed in claim 11, wherein said first and second linear parts comprise thin film resistors.

13. The semiconductor device as claimed in claim 11, wherein said first and second linear parts comprise diffused regions injected with impurities by ion implantation.

14. The semiconductor device as claimed in claim 11, wherein said connecting part also forms a resistor.

15. The semiconductor device as claimed in claim 11, wherein said first and second linear parts have the same area.

16. The semiconductor device as claimed in claim 11, wherein said first and second dielectric isolation regions, said first and second linear parts and said connection part form a group, and a plurality of groups are provided.

17. A semiconductor device, comprising:

first and second dielectric isolation regions having a predetermined distance therebetween and defining a region between said first and second dielectric isolation regions; and a resistance element provided in said region defined between said first and second dielectric isolation regions, said resistance element comprising first and second parts having a substantially linear pattern, each of said first and second parts being selectively doped, and a connection part connecting said first and second parts, said first part being located close to said first isolation region than a central portion of said region defined between said first and second dielectric isolation regions, and said second part being located closer to said second isolation region than the central portion of said region defined between said first and second dielectric isolation regions.

18. The semiconductor device as claimed in claim 17, wherein said first and second parts comprise thin film resistors.

19. The semiconductor device as claimed in claim 17, wherein said first and second parts comprise diffused regions injected with impurities by ion implantation.

20. The semiconductor device as claimed in claim 17, wherein said connection part also forms a resistor.

21. The semiconductor device as claimed in claim 17, wherein said first and second parts have the same area.

22. The semiconductor device as claimed in claim 17, wherein said first and second dielectric isolation regions, said first and second parts and said connection part form a group, and a plurality of groups are provided.

* * * * *